US009063169B2

(12) United States Patent  (10) Patent No.: US 9,063,169 B2
Yang et al.  (45) Date of Patent: Jun. 23, 2015

(54) APPARATUS AND METHOD FOR MEASURING ELECTRICAL PARAMETERS OF CIRCUIT

(75) Inventors: Chu-Sing Yang, Tainan (TW); Chao-Yang Lee, Tainan (TW)

(73) Assignee: NATIONAL CHENG KUNG UNIVERSITY (TW)

(*) Notice: Subject to any disclaimer, the term of this patent is extended or adjusted under 35 U.S.C. 154(b) by 526 days.

(21) Appl. No.: 13/422,618

(22) Filed: Mar. 16, 2012

(65) Prior Publication Data

US 2012/0262153 A1  Oct. 18, 2012

(30) Foreign Application Priority Data

Mar. 17, 2011 (TW) .............................. 100109224 A

(51) Int. Cl.
| | |
|---|---|
| G01R 1/00 | (2006.01) |
| G01R 11/02 | (2006.01) |
| G01R 1/04 | (2006.01) |
| G01R 31/28 | (2006.01) |
| G01R 22/10 | (2006.01) |
| H02J 13/00 | (2006.01) |

(52) U.S. Cl.
CPC .............. *G01R 1/04* (2013.01); *G01R 31/2825* (2013.01); *G01R 22/10* (2013.01); *H02J 13/0079* (2013.01)

(58) Field of Classification Search
CPC ........ G01R 11/36; G01R 1/04; G01R 22/066; G01R 22/10; G01R 31/2825; G01R 19/16; G01R 19/2513; G01R 21/00; G01R 21/133; G01R 31/02; G01R 19/00; G01R 21/06; G01R 1/206; G01R 21/1331; G01R 31/085; G01R 1/00; G01R 11/02; H04W 88/085; G06F 19/00; G06K 1/00; H02J 13/0079
See application file for complete search history.

(56) References Cited

U.S. PATENT DOCUMENTS

| | | | | |
|---|---|---|---|---|
| 4,120,031 | A * | 10/1978 | Kincheloe et al. ............ | 705/412 |
| 4,901,007 | A * | 2/1990 | Sworm ......................... | 324/110 |
| 5,424,903 | A * | 6/1995 | Schreiber ..................... | 361/166 |
| 6,828,695 | B1 | 12/2004 | Hansen | |
| 7,540,767 | B1 * | 6/2009 | Czarnecki ..................... | 439/517 |
| 2010/0094475 | A1 | 4/2010 | Masters et al. | |
| 2012/0143539 | A1 * | 6/2012 | Krause ........................... | 702/62 |

FOREIGN PATENT DOCUMENTS

| | | |
|---|---|---|
| CN | 101740953 A | 6/2010 |
| TW | 1239177 | 9/1991 |
| TW | 1329948 | 9/2010 |

OTHER PUBLICATIONS

Office Action issued in corresponding Chinese Patent Application No. 201210070078.1 on Dec. 25, 2013, consisting of 10 pp.

* cited by examiner

*Primary Examiner* — Vinh Nguyen
(74) *Attorney, Agent, or Firm* — Volpe and Koenig, P.C.

(57) ABSTRACT

An apparatus for measuring an electrical parameter of a circuit includes a measuring unit, a plurality of connection terminals and a selection switch. The measuring unit measures the electrical parameter. The selection switch selectively causes a conduction between the selection switch and at least one of the plurality of connection terminals.

9 Claims, 12 Drawing Sheets

601

In a first period, a first selection switch 412 selectively causes a first conduction between a measuring unit 410 and one (such as a1-1) of a plurality of first connection terminals a1-1, a1-2, a1-3, a1-4 and a1-5, and a plurality of second selection switches 441, 442, 443, 444 and 445 selectively causes a second conduction between one (such as 431) of a plurality of appliances 431, 432, 433, 434 and 435 and one (such as a2-1) of a plurality of second connection terminals a2-1, a2-2, a2-3, a2-4 and a2-5.

602

In a second period, the first selection switch 412 selectively causes a third conduction between the measuring unit 410 and another one (such as a1-2) of the plurality of first connection terminals a1-1, a1-2, a1-3, a1-4 and a1-5, and the plurality of second selection switches 441, 442, 443, 444 and 445 selectively causes a fourth conduction between another one (such as 432) of the plurality of appliances 431, 432, 433, 434 and 435 and another one (such as a2-2) of the plurality of second connection terminals a2-1, a2-2, a2-3, a2-4 and a2-5.

In a first period, a plurality of matrix switch units 751, 752 and 753 selectively causes a first conduction between one (such as 751) of a plurality of matrix switch units 751, 752 and 753 and a second connection terminal (such as a7-1) included in one (such as 741) of a plurality of connection terminal groups 741, 742 and 743.

702

In a second period, the plurality of matrix switch units 751, 752 and 753 selectively causes a second conduction between another one (such as 752) of the plurality of matrix switch units 751, 752 and 753 and a third connection terminal (such as a8-1) included in another one (such as 742) of the plurality of connection terminal groups 741, 742 and 743.

Fig. 6(b)

APPARATUS AND METHOD FOR MEASURING ELECTRICAL PARAMETERS OF CIRCUIT

FIELD OF INVENTION

The present invention relates to a measuring apparatus, and more particularly to a measuring apparatus associated with one of an intelligent socket and an intelligent meter.

BACKGROUND

The power-source monitoring applied to the energy saving has become indispensable in the modern technologies of the green energy. A variety of appliances are used in the current life. When the appliances can be connected to one of the intelligent socket and the intelligent meter for power-source monitoring beforehand, the energy saving can be further achieved.

Regarding the application system of the conventional intelligent sockets, firstly, the conventional intelligent sockets should be plugged into the power-source sockets, and then the appliances are plugged into the intelligent sockets. It is necessary for each appliance, to be monitored, to attach a respective intelligent socket to the respective power-source socket of the each appliance, thereby performing the switch control, the state detection and the energy-consumption to the each appliance. Additionally, the application system may further make the measurement and the monitoring to at least one of the voltage, the current, the power consumption and the energy consumption for the each appliance. However, this configuration which one appliance corresponds to one intelligent socket limits the layout elasticity of the intelligent sockets, wherein when a specific intelligent socket has a fault, the application system cannot measure the appliance collocated therewith so as to limit the measurement function of the specific intelligent socket.

A smart master-slave socket is provided in the Taiwan invention patent with the patent No. I329948, and may achieve the purpose of lowering the standby power. Please refer to FIG. 1(a) and FIG. 1(b). FIG. 1(a) is a schematic diagram showing a smart master-slave socket system 9 in the prior art. FIG. 1(b) is a detailed schematic diagram showing the smart master-slave socket system 9 in the prior art. As shown in FIG. 1(a) and FIG. 1(b), the smart master-slave socket system 9 includes a smart master-slave socket 10, an indoor alternating-current power line AC1 and a remote control device 7. The smart master-slave socket 10 includes a switch unit 1 and a monitoring device 8. The monitoring device 8 includes a detection unit 2, a control unit 3, a protection unit 4, a micro-control unit 5, and a communication unit 6. The control unit 3 includes a plurality of semiconductor switches 33, a driving circuit 32 and a control circuit 31. The switch unit 1 includes a master socket 11 and four slave sockets 12. The master socket 11 and the slave sockets 12 are connected to the plurality of semiconductor switches 33, respectively, and are connected to the indoor alternating-current power line AC1. The indoor alternating-current power line AC1 is connected to the communication unit 6.

The micro-control unit 5 is used to make the signal control and the signal operation. The communication unit 6 is used to transmit and receive the commands, so that the user may turn on or turn off the master socket 11 and the slave sockets 12 through a home control network (not shown). The detection unit 2 measures the power consumption condition of an electronic product, wherein the electronic product is connected to the master socket 11. When the power consumption quantity of the electronic product detected by the detection unit 2 is less than a rated value, the detection unit 2 notifies the micro-control unit 5 to make a standby process. The control unit 3 receives a control signal from the micro-control unit 5 for turning on or turning off the master socket 11 and the slave sockets 12.

In FIG. 1(a), the communication unit 6 receives a command signal from the remote control device 7 to generate an action. The communication unit 6 may utilize a wireless ZigBee communication protocol, a Bluetooth interface, or a wired power line data transmission module to perform the monitoring of the electrical parameters, wherein the electrical parameters include the voltage, the current, the watt number, the degree number, or the like. Additionally, the monitoring device 8 may also meet the requirement to remotely control or time-definitely control whether to supply the power or not. However, when one of the detection unit 2, the control unit 3, the protection unit 4, the micro-control unit 5 and the communication unit 6 has a fault, the control of the switch unit 1 will be affected. Under this condition, another monitoring device 8 cannot be used to monitor the switch unit 1, and the monitoring device 8 cannot monitor a plurality of switch units 1.

An appliance control method is provided in the Taiwan invention patent with the patent No. I239177. The appliance control method uses a power line to serve as a transmission medium, and uses an original control code compatible with the conventional appliances. The appliance control method may transform the common commercial power-line communication protocol into control codes for different brands of appliances or different kinds of appliances on the market, and may retain the control codes for different brands of appliances in order that the appliance manufacturer can more easily develop the intelligent appliances. However, the appliance control method still needs the transformation of the power-line communication protocol and the translation of the control code.

SUMMARY

It is an object of the present invention to provide a measuring-easy method, which may not be limited in the transformation of the communication protocol and the translation of the control code. Moreover, in the present invention, a measuring unit may measure a plurality of appliances; a plurality of measuring unit may measure an appliance; or a plurality of measuring units may measure a plurality of appliances.

It is an embodiment of the present invention to provide an apparatus for measuring an electrical parameter of a circuit. The apparatus includes a measuring unit, a plurality of first connection terminals and a first selection switch. The measuring unit measures the electrical parameter. The first selection switch selectively causes a first conduction between the first selection switch and at least one of the plurality of first connection terminals.

It is another embodiment of the present invention to provide an apparatus for measuring an electrical parameter of a circuit. The apparatus includes a first measuring unit, a plurality of first connection terminals and a first matrix switch unit. The first measuring unit measures the electrical parameter. The first matrix switch unit selectively causes a first conduction between the first matrix switch unit and at least one of the plurality of first connection terminals.

It is still another embodiment of the present invention to provide a method for measuring an electrical parameter of a circuit. The method includes the following steps. A measuring apparatus is provided, wherein the measuring apparatus includes a first terminal, at least a second terminal, a first selection switch and at least a second selection switch. In a first period, the first selection switch is caused to selectively form a first conduction between the first selection switch and the first connection terminal. In a second period, the second selection switch is caused to selectively form a second conduction between the second selection switch and the second connection terminal.

BRIEF DESCRIPTION OF THE DRAWINGS

The foregoing and other features and advantages of the present invention will be more clearly understood through the following descriptions with reference to the drawings, wherein:

FIG. 6(a) shows a method of measuring electrical parameters of a circuit of the present application; and FIG. 6(b) shows a method of measuring electrical parameters of a circuit of the present application.

DETAILED DESCRIPTION OF THE PREFERRED EMBODIMENTS

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1A:
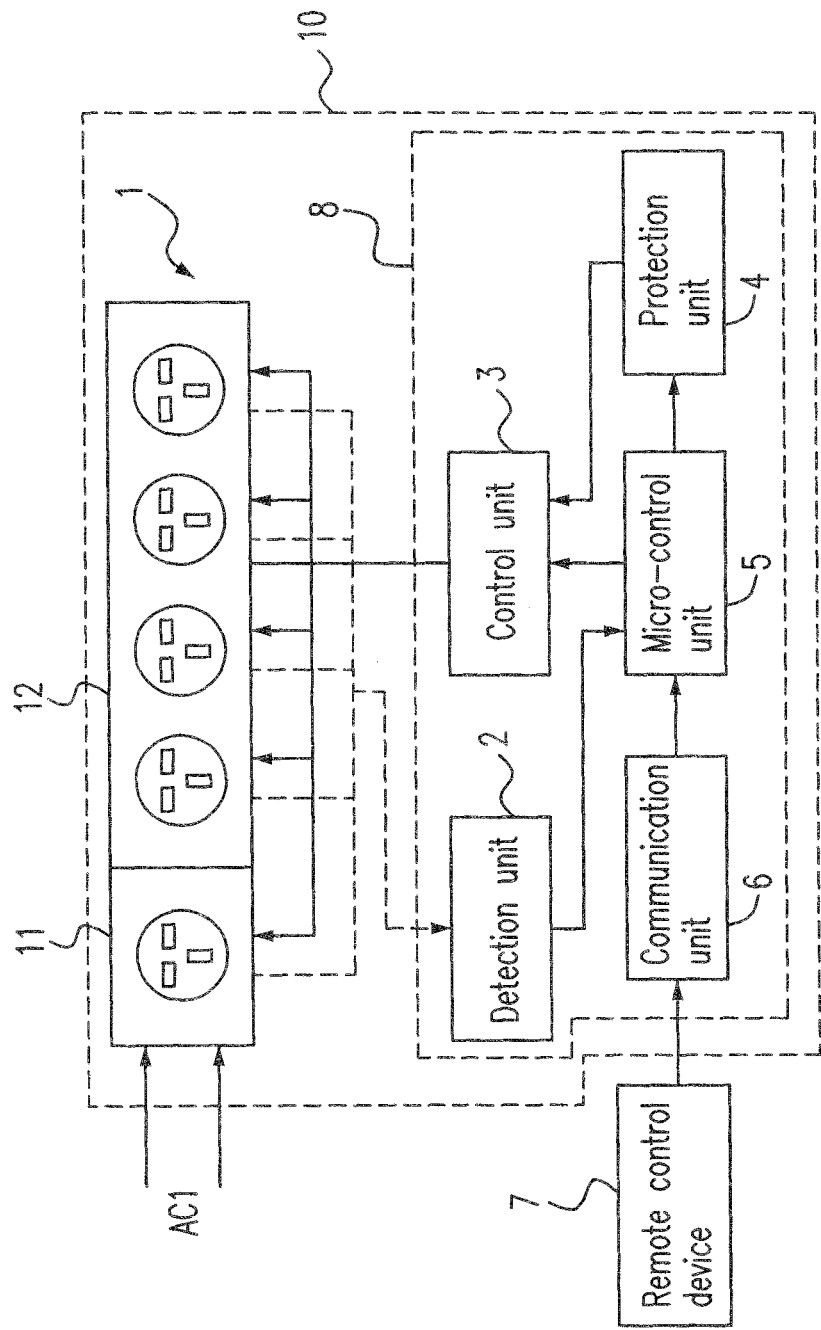
FIGS. 1(a) and 1(b) are detailed schematic diagrams showing the smart master-slave socket system in the prior art.
Figure 1B:
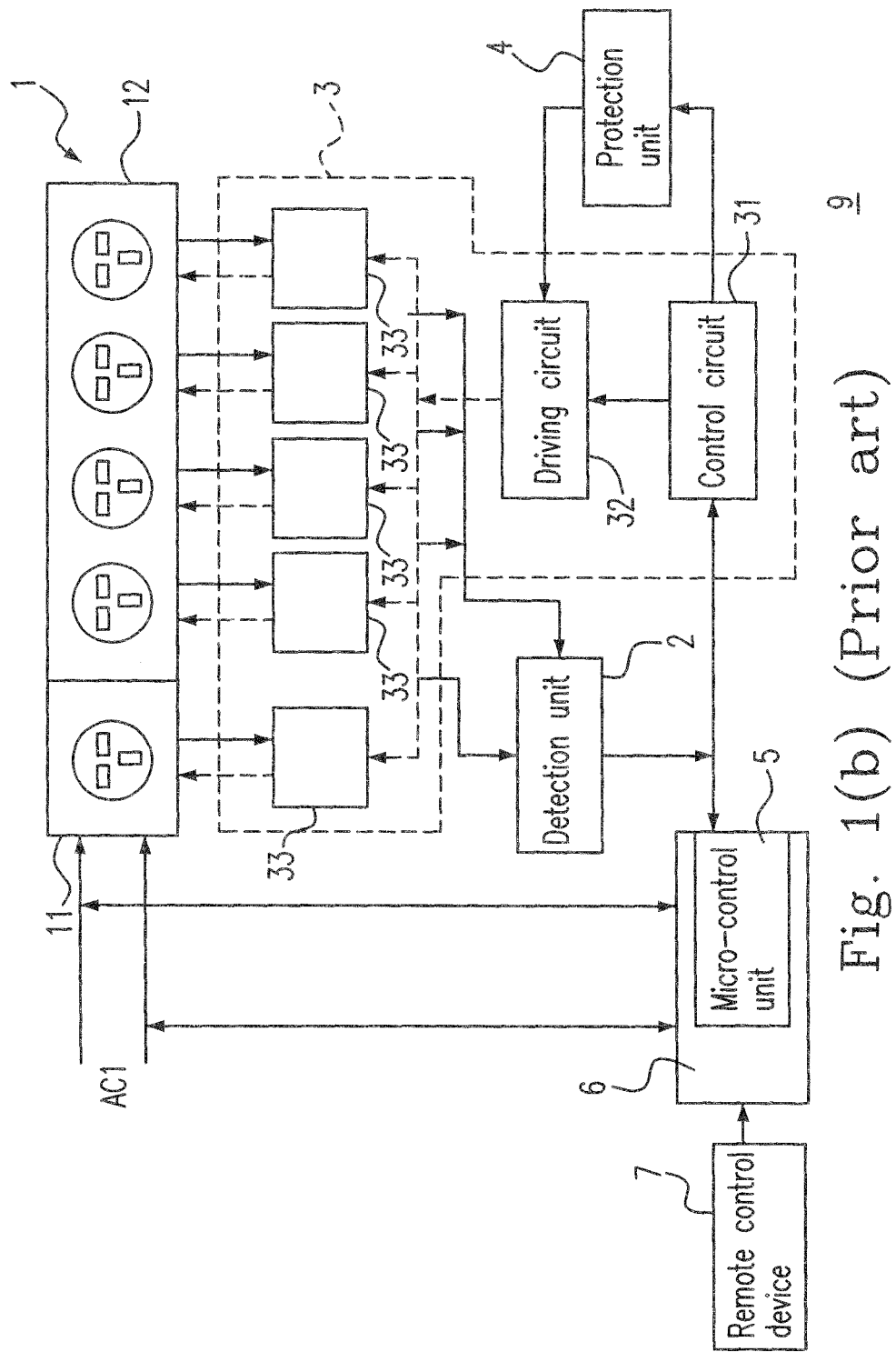
Figure 2:
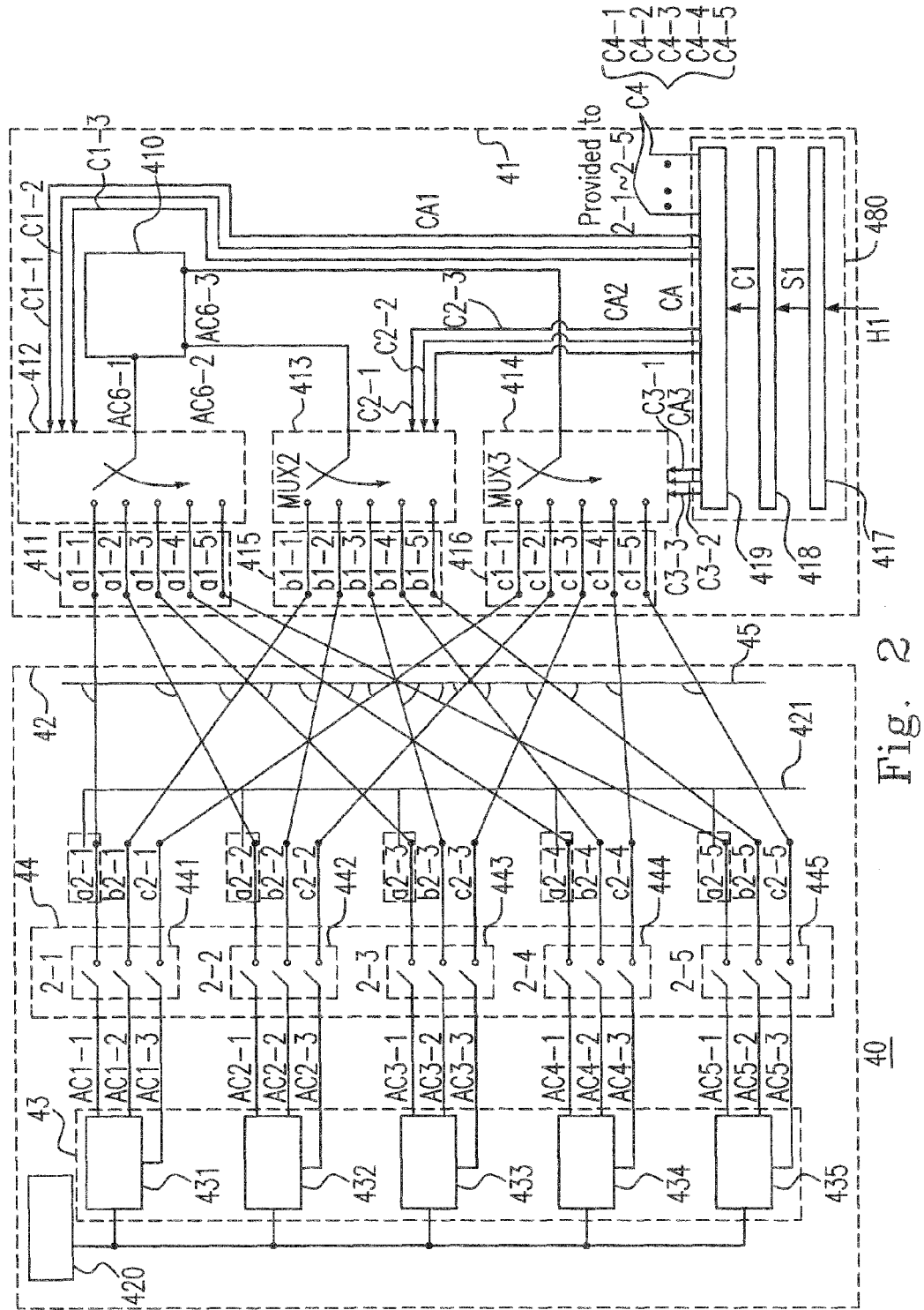
FIG. 2 is a schematic diagram showing a measuring system according to the first preferred embodiment of the present invention.

Please refer to FIG. 2, which is a schematic diagram showing a measuring system 40 according to the first preferred embodiment of the present invention. The measuring system 40 includes a measuring apparatus 41 and a circuit 42. The measuring apparatus 41 is used to measure an electrical parameter of the circuit 42, and includes a measuring unit 410, a plurality of first connection terminals 411, and a first selection switch 412. The first selection switch 412 preferably is a multiplexer. The measuring unit 410 preferably includes one of an intelligent socket and an intelligent meter. The plurality of first connection terminals 411 include connection terminals a1-1, a1-2, a1-3, a1-4 and a1-5. The measuring unit 410 is used to measure the electrical parameter, which includes at least one of a voltage, a current, a power consumption and an energy consumption. The first selection switch 412 may selectively cause a conduction between the measuring unit 410 and one of the plurality of first connection terminals 411; i.e., the one is one of the connection terminals a1-1, a1-2, a1-3, a1-4 and a1-5.

The circuit 42 includes at least one appliance 43, at least one second connection terminal 421, at least one second selection switch 44 and at least one wire 45. In any one embodiment of the present invention, the number of appliances may be dependent on the demand and not be limited to only have five ones. In the first preferred embodiment of the present invention, the at least one appliance 43 includes a plurality of appliances 431, 432, 433, 434 and 435. The at least one second connection terminal 421 includes the connection terminals a2-1, a2-2, a2-3, a2-4 and a2-5. The at least one second selection switch 44 includes switches 441, 442, 443, 444 and 445. The at least one wire 45 includes a wire (which is expressed as a wire a1-1_a2-1) between the connection terminal a1-1 and the connection terminal a2-1, and a wire (which is expressed as a wire a1-2_a2-2) between the connection terminal a1-2 and the connection terminal a2-2. The other similar wires and the wire connections thereof are shown in FIG. 2.

In FIG. 2, the circuit 42 further includes an alternate-current (AC) power source 420. The AC power source 420 provides a single-phase AC voltage of 110 V or 220 V to the at least one appliances 43, or provides a three-phase AC voltage of 110 V or 220 V to the at least one appliances 43, which is dependent on the demand. The appliance 431 includes a plurality of connection pins AC1-1, AC1-2 and AC1-3. The connection pins AC1-1 and AC1-2 is used when the AC power source 420 provides the single-phase AC voltage of 110 V or 220 V. The additional connection pin AC1-3 may be used when the AC power source 420 provides the three-phase AC voltage of 110 V or 220V. For instance, the connection pins AC1-1 and AC1-2 may be coupled to the input terminals of the appliance 431, respectively, which are connected to the AC power source 420. Similarly, the appliance 432 includes a plurality of connection pins AC2-1, AC2-2 and AC2-3; the appliance 433 includes a plurality of connection pins AC3-1, AC3-2 and AC3-3; the appliance 434 includes a plurality of connection pins AC4-1, AC4-2 and AC4-3; and the appliance 435 includes a plurality of connection pins AC5-1, AC5-2 and AC5-3. The measuring unit 410 includes a plurality of connection pins AC6-1, AC6-2 and AC6-3; the connection pins AC6-1 and AC6-2 are used when the AC power source 420 provides the single-phase AC voltage of 110 V or 220 V; the connection pins AC6-1, AC6-2 and AC1-3 are used when the AC power source 420 provides the three-phase AC voltage of 110 V or 220 V; and the plurality of connection pins AC6-1, AC6-2 and AC6-3 corresponds to the plurality of connection pins AC1-1, AC1-2 and AC1-3, respectively.

In one embodiment, the plurality of connection pins AC6-1, AC6-2 and AC6-3 of the measuring unit 410 are connected to a plurality of connection pins (such as the connection pins AC2-1, AC2-2 and AC2-3) of one of the plurality of appliances 431, 432, 433, 434 and 435, respectively, in a first period for measuring the voltage of the one appliance (such as the appliance 432); and the measured voltage may be used to calculate at least one of the other electrical parameters, such as the current, the watt consumption number and the power consumption. The plurality of connection pins AC6-1, AC6-2 and AC6-3 of the measuring unit 410 may be connected to another plurality of connection pins (such as the connection pins AC4-1, AC4-2 and AC4-3) of another one of the plurality of appliances 431, 432, 433, 434 and 435 in a second period, respectively, for measuring the voltage (another electrical parameter) of the another appliance (such as the appliance 434).

Each of the switches 441, 442, 443, 444 and 445 may be a respective relay or a respective transistor switch. In any one embodiment of the present invention, when the respective relay is employed, the switches 441, 442, 443, 444 and 445 may be relays 2-1, 2-2, 2-3, 2-4 and 2-5, respectively, and the respective relay may include three switches, which are simultaneously turned on or turned off. For instance, the relay 2-1 causes a conduction between the appliance 431 and the connection terminal a2-1, a conduction between the appliance 431 and the connection terminal b2-1, and a conduction between the appliance 431 and the connection terminal c2-1; the relay 2-2 causes a conduction between the appliance 432 and the connection terminal a2-2, a conduction between the appliance 432 and the connection terminal b2-2, and a conduction between the appliance 432 and the connection terminal c2-2; and the others are similar. When the respective transistor switch is employed, the three switches in the respective relay may be replaced with three transistors to form the transistor switch. The three transistors have three on-off states, respectively, which may be respectively controlled.

The measuring apparatus 41 further includes a third selection switch 413, a fourth selection switch 414, a plurality of third connection terminals 415 corresponding to the plurality of first connection terminals 411, respectively, and a plurality of fourth connection terminals 416 corresponding to the plurality of first connection terminals 411, respectively. Each of the third selection switch 413 and the fourth selection switch 414 is preferably a respective multiplexer. The third selection switch 413 may selectively causes a conduction between the measuring unit 410 and one of the plurality of third connection terminals 415, wherein the one of the plurality of third connection terminals 415 corresponds to the one of the plurality of first connection terminals 411. For instance, when the first selection switch 412 selectively causes a conduction between the measuring unit 410 and the connection terminal a1-1 of the plurality of first connection terminals 411, the third selection switch 413 may selectively causes a conduction between the measuring unit 410 and the connection terminal b1-1 of the plurality of third connection terminals 415, wherein the connection terminal b1-1 corresponds to the connection terminal a1-1. Similarly, the connection terminal b1-2 corresponds to the connection terminal a1-2, and the connection terminal b1-3 corresponds to the connection terminal a1-3.

The fourth selection switch 414 may selectively causes a conduction between the measuring unit 410 and one of the plurality of fourth connection terminals 416, wherein the one of the plurality of fourth connection terminals 416 corresponds to the one of the plurality of first connection terminals 411. For instance, when the first selection switch 412 selectively causes a conduction between the measuring unit 410 and the connection terminal a1-1 of the plurality of first connection terminals 411, the fourth selection switch 414 may selectively causes a conduction between the measuring unit 410 and the connection terminal c1-1 of the plurality of fourth connection terminals 416, wherein the connection terminal c1-1 corresponds to the connection terminal a1-1. Similarly, the connection terminal c1-2 corresponds to the connection terminal a1-2, and the connection terminal c1-3 corresponds to the connection terminal a1-3. In one embodiment, each of the selection switches 412, 413 and 414 may be a respective throw-over switch, which has a common terminal and five throw terminals.

The measuring apparatus 41 further includes a processing unit 417, a communication interface 416 and at least one decode unit 417. The processing unit 417 receives or generates a first instruction H1, and transforms the first instruction H1 into a signal S1. The communication interface 416 is connected to the processing unit 417, and transforms the signal S1 into a signal C1 according to a communication protocol of the communication interface 416, wherein the signal C1 conforms to the communication protocol, and the communication interface 416 includes one of an inter-integrated circuit ($I^2C$) control interface, a serial peripheral interface bus (SPI) control interface, an RS-232 standard control interface and an infrared control interface. The at least one decode unit 417 is connected to the communication interface 416, and transforms the signal C1 into a control signal CA, wherein the signal C1 is used to turn on the first selection switch 412 and the at least one selection switch 44, or control the on-off states of the selection switches 412, 413, 414, 441, 442, 443, 444 and 445.

The at least one decode unit 417 decode the signal C1 to generate the control signal CA, wherein the control signal CA includes control signals CA1, CA2, CA3 and C4, the control signal CA1 includes control signals C1-1, C1-2 and C1-3, the control signal CA2 includes control signals C2-1, C2-2, C2-3, the control signal CA3 includes control signals C3-1, C3-2, C3-3, and the control signal C4 includes the control signals C4-1, C4-2, C4-3, C4-4, and C4-5. The control signal CA1 is used to control the first selection switch 412; the control signal CA2 is used to control the third selection switch 415; the control signal CA3 is used to control the fourth selection switch 412; and the control signals C4-1, C4-2, C4-3, C4-4, and C4-5 are used to control the switches 441, 442, 443, 444 and 445, respectively. In one embodiment, the measuring apparatus 41 further includes a control unit 480, which includes the processing unit 417, the communication interface 416 and the at least one decode unit 417. The control unit 480 receives or generates the first instruction H1, and transforms the first instruction H1 into the control signal CA.

In the first preferred embodiment of the present invention, for instance, when the user (or the control unit 480) want the measuring unit 410 to measure the voltage of the appliance 431, the user provides the first instruction H1 to the processing unit 417 (or the processing unit 417 provides the first instruction H1) to generate the control signal CA in a first period for controlling the relays 2-1, 2-2, 2-3, 2-4 and 2-5, and the first, the third and the fourth selection switches 412, 413 and 414. In the first period, the control signal CA controls each of the relays 2-2, 2-3, 2-4 and 2-5 to turn off, controls the first selection switch 412 to cause a conduction between the measuring unit 410 and the connection terminal a1-1, controls the third selection switch 413 to cause a conduction between the measuring unit 410 and the connection terminal b1-1, and controls the fourth selection switch 414 to cause a conduction between the measuring unit 410 and the connection terminal c1-1, controls the relay 2-1 to cause a conduction between the appliance 431 and the connection terminal a2-1, a conduction between the appliance 431 and the connection terminal b2-1, and a conduction between the appliance 431 and the connection terminal c2-1. The relays 2-1, 2-2, 2-3, 2-4 and 2-5, and the first, the third and the fourth selection switches 412, 413 and 414 are controlled to meet to the measurement requirement of the three-phase AC voltage of 110/220 V. The relays 2-1, 2-2, 2-3, 2-4 and 2-5, and the first, the third and the fourth selection switches 412, 413 and 414 are controlled to meet to the measurement requirement of the single-phase AC voltage of 110/220 V when the fourth selection switch 414 is turned off.

When the user (or the control unit 480) want the measuring unit 410 to measure the voltage of the appliance 433, the user provides a second instruction to the processing unit 417 (or the processing unit 417 provides the second instruction) to generate a control signal (similar to CA) in a second period for controlling the relays 2-1, 2-2, 2-3, 2-4 and 2-5, and the first, the third and the fourth selection switches 412, 413 and 414. In the second period, the control signal (similar to CA) controls each of the relays 2-1, 2-2, 2-4 and 2-5 to turn off, controls the first selection switch 412 to cause a conduction between the measuring unit 410 and the connection terminal a1-3, controls the third selection switch 413 to cause a conduction between the measuring unit 410 and the connection terminal b1-3, and controls the fourth selection switch 414 to cause a conduction between the measuring unit 410 and the connection terminal c1-3, controls the relay 2-3 to cause a conduction between the appliance 433 and the connection terminal a2-3, a conduction between the appliance 433 and the connection terminal b2-3, and a conduction between the appliance 433 and the connection terminal c2-3. For instance, the second period is adjacent to the first period.

Figure 3:
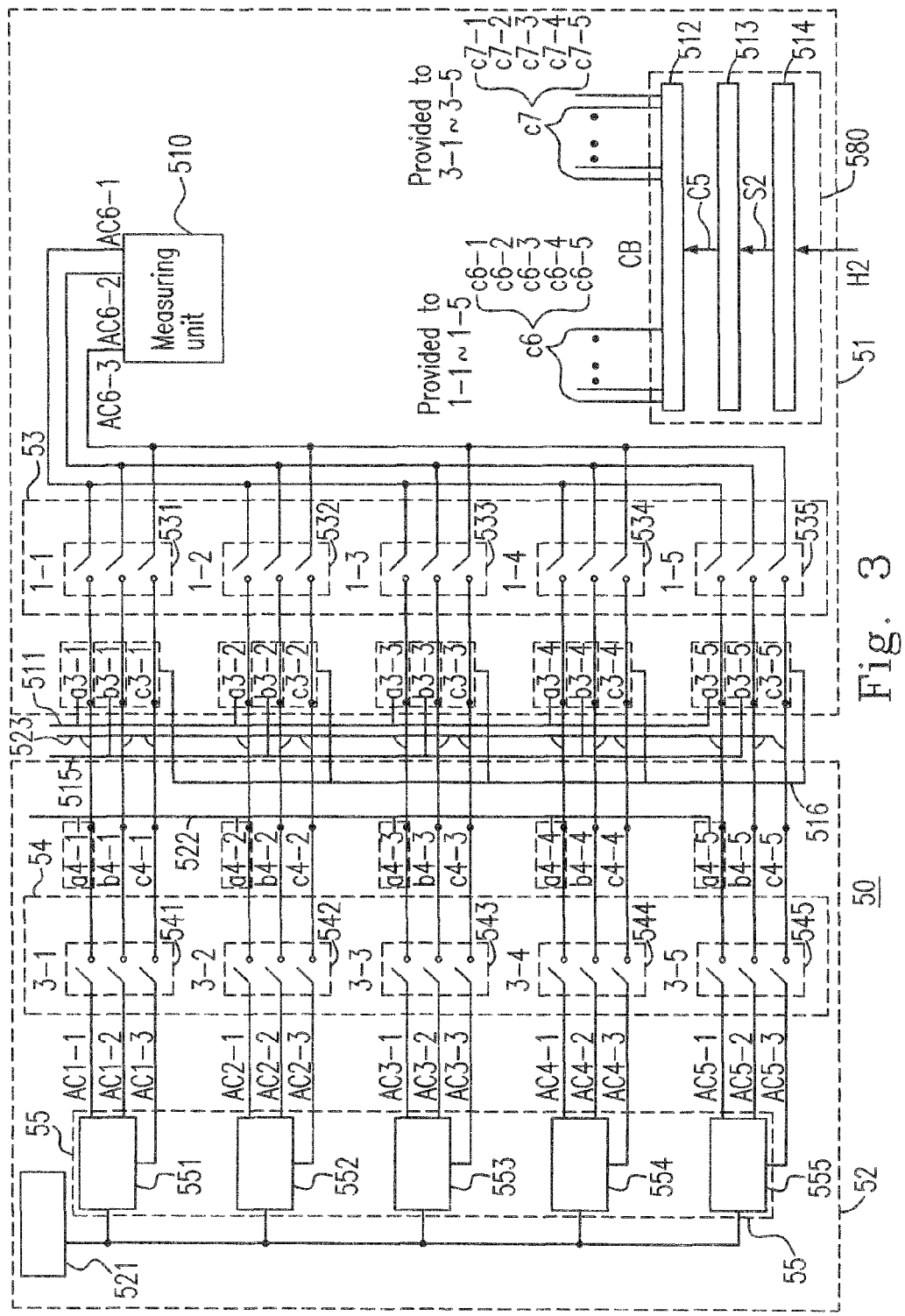
FIG. 3 is a schematic diagram showing a measuring system according to the second preferred embodiment of the present invention.

Please refer to FIG. 3, which is a schematic diagram showing a measuring system 50 according to the second preferred embodiment of the present invention. The measuring system 50 includes a measuring apparatus 51 and a circuit 52. The measuring apparatus 51 includes a measuring unit 510, a plurality of first connection terminals 511, and a plurality of first selection switches 53. The plurality of first selection switches 53 includes switches 531, 532, 533, 534 and 535, which may be preferably relays 1-1, 1-2, 1-3, 1-4 and 1-5, respectively. The plurality of first connection terminals 511 includes connection terminals a3-1, a3-2, a3-3, a3-4 and a3-5. The measuring unit 510 is used to measure an electrical parameter of the circuit 52, which includes at least one of a voltage, a current, a power consumption and an energy consumption.

The plurality of first selection switches 53 are electrically connected to the plurality of first connection terminals 511, respectively. When one of the plurality of first selection switches 53 being a first specific switch is selected, the first specific switch causes a conduction between the first specific switch and one of the plurality of first connection terminals 511, being a first specific terminal, corresponding to the first specific switch. For instance, in a first period, when one of the plurality of first selection switches 53 being a first specific switch 531 is selected, the first specific switch 531 causes a conduction between the first specific switch 531 and one of the plurality of first connection terminals 511, being a first specific terminal a3-1, corresponding to the first specific switch 531; and in a second period, when one of the plurality of first selection switches 53 being a second specific switch 532 is selected, the second specific switch 532 causes a conduction between the second specific switch 532 and one of the plurality of first connection terminals 511, being a second specific terminal a3-2, corresponding to the second specific switch 532.

In FIG. 3, the circuit 52 further includes an AC power source 521. The AC power source 521 provides a single-phase AC voltage of 110 V or 220 V to at least one appliance 55, or provides a three-phase AC voltage of 110 V or 220 V to the at least one appliance 55, which is dependent on the demand. The circuit 52 includes the at least one appliance 55, at least one second connection terminal 522, at least one second selection switch 54, and at least one wire 523. The at least one second selection switch 54 is respectively connected to the at least one appliance 55 corresponding respectively thereto. The each second selection switch corresponds to a respective appliance, further corresponds to a respective second connection terminal, and selectively causes a conduction between the respective appliance and the respective second connection terminal. In the second preferred embodiment of the present invention, the at least one appliance 55 includes appliances 551, 552, 553, 554 and 555. The at least one second selection switch 54 includes switches 541, 542, 543, 544 and 545, which are preferably relays 3-1, 3-2, 3-3, 3-4 and 3-5, respectively. The at least one second connection terminal 522 includes connection terminals a4-1, a4-2, a4-3, a4-4 and a4-5. The at least one wire 523 includes a wire (which is expressed as a wire a3-1_a4-1) between the connection terminal a3-1 and the connection terminal a4-1, a wire (which is expressed as a wire a3-2_a3-2) between the connection terminal a3-2 and the connection terminal a3-2. The other similar wires and the wire connections thereof are shown in FIG. 3.

In the second preferred embodiment of the present invention, for instance, when the switch 541 is turned on, the switch 541 causes a conduction between the appliance 551 and the connection terminal a4-1; and when the switch 542 is turned on, the switch 542 causes a conduction between the appliance 552 and the connection terminal a4-2. For instance, the connection terminal a3-1 corresponding to the connection terminal a4-1 is connected to the connection terminal a4-1 to form the wire a3-1_a4-1. The connection terminal a3-2 corresponding to the connection terminal a4-2 is connected to the connection terminal a4-2 to form the wire a3-2_a4-2.

The measuring apparatus 51 further includes a plurality of third connection terminals 515, corresponding to the plurality of first connection terminals 511, respectively, and a plurality of fourth connection terminals 516, corresponding to the plurality of first connection terminals 511, respectively. The plurality of first selection switches 53 are electrically connected to the plurality of third connection terminals 515, respectively. When one of the plurality of first selection switches 53 being the first specific switch is selected, the first specific switch causes a conduction between the first specific switch and one of the plurality of third connection terminals 515, being a third specific terminal, corresponding to the first specific switch. For instance, in the first period, when one of the plurality of first selection switches 53 being the first specific switch 531 is selected, the first specific switch 531 causes a conduction between the first specific switch 531 and one of the plurality of third connection terminals 515, being a third specific terminal b3-1, corresponding to the first specific switch 531; and in the second period, when one of the plurality of first selection switches 53 being the second specific switch 532 is selected, the second specific switch 532 causes a conduction between the second specific switch 532 and one of the plurality of third connection terminals 515, being a fourth specific terminal b3-2, corresponding to the second specific switch 532.

The plurality of first selection switches 53 are electrically connected to the plurality of fourth connection terminals 516, respectively. When one of the plurality of first selection switches 53 being the first specific switch is selected, the first specific switch causes a conduction between the first specific switch and one of the plurality of fourth connection terminals 516, being a fifth specific terminal, corresponding to the first specific switch. For instance, in the first period, when one of the plurality of first selection switches 53 being the first specific switch 531 is selected, the first specific switch 531 causes a conduction between the first specific switch 531 and one of the plurality of fourth connection terminals 516, being a fifth specific terminal c3-1, corresponding to the first specific switch 531; and in the second period, when one of the plurality of first selection switches 53 being the second specific switch 532 is selected, the second specific switch 532 causes a conduction between the second specific switch 532 and one of the plurality of fourth connection terminals 516, being a sixth specific terminal c3-2, corresponding to the second specific switch 532. Each of relays 1-1, 1-2, 1-3, 1-4, 1-5, 3-1, 3-2, 3-3, 3-4 and 3-5 includes three respective switches. When a specific relay in the relays 1-1, 1-2, 1-3, 1-4, 1-5, 3-1, 3-2, 3-3, 3-4 and 3-5 is selected, the three respective switches of the specific relay are simultaneously turned on.

The measuring apparatus 51 further includes a processing unit 514, a communication interface 513 and at least one decode unit 512. The processing unit 514 receives or generates a second instruction H2, and transforms the second instruction H2 into a signal S2. The communication interface 513 is connected to the processing unit 514, and transforms the signal S2 into a signal C5 according to a communication protocol of the communication interface 513, wherein the signal C5 conforms to the communication protocol, and the communication interface 513 includes one of an inter-integrated circuit ($I^2C$) control interface, a serial peripheral interface bus (SPI) control interface, an RS-232 standard control interface and an infrared control interface. The at least one decode unit 512 is connected to the communication interface 513, and transforms the signal C5 into a control signal CB, wherein the control signal CB is used to turn on the one of the plurality of first selection switches 53 and the one of the plurality of first selection switches 54 corresponding to the one of the plurality of first selection switches 53, or control the on-off states of switches 531, 532, 533, 534, 535, 541, 542, 543, 544 and 545. The at least one decode unit 417 decode the signal C5 to generate the control signal CB, wherein the control signal CB includes control signals C6 and C7. The control signal C6 includes control signals C6-1, C6-2, C6-3, C6-4 and C6-5, which control the switches 531, 532, 533, 534 and 535, respectively. The control signal C7 includes control signals C7-1, C7-2, C7-3, C7-4 and C7-5, which control the switches 541, 542, 543, 544 and 545, respectively. In one embodiment, the measuring apparatus 41 further includes a control unit 580, which includes the processing unit 514, the communication interface 513 and the at least one decode unit 512. The control unit 580 receives or generates the second instruction H2, and transforms the second instruction H2 into the control signal CB.

In the second preferred embodiment of the present invention, for instance, when the user (or the control unit 580) want the measuring unit 510 to measure the voltage of the appliance 551, the user provides the second instruction H2 to the processing unit 514 (or the processing unit 514 provides the second instruction H2) to generate the control signal CB in the first period for controlling the switches 531 and 541, wherein the control signal CB controls each of the switches 531 and 541 to turn on, and controls each of the switches 532, 533, 534, 535, 542, 543, 544 and 545 to turn off. In the first period, the control signal CB controls the switch 531 to cause a conduction between the measuring unit 510 and the connection terminal a3-1, a conduction between the measuring unit 510 and the connection terminal b3-1, and a conduction between the measuring unit 510 and the connection terminal c3-1; and in the first period, the control signal CB controls the switch 541 to cause a conduction between the appliance 551 and the connection terminal a4-1, a conduction between the appliance 551 and the connection terminal b4-1, and a conduction between the appliance 551 and the connection terminal c4-1.

When the user (or the control unit 580) want the measuring unit 510 to measure the voltage of the appliance 552, the user provides a third instruction to the processing unit 514 (or the processing unit 514 provides the third instruction) to generate a control signal (similar to CB) in the second period for controlling the switches 532 and 542, wherein the control signal (similar to CB) controls each of the switches 532 and 542 to turn on, and controls each of the switches 531, 533, 534, 535, 541, 543, 544 and 545 to turn off. In the second period, the control signal (similar to CB) controls the switch 532 to cause a conduction between the measuring unit 510 and the connection terminal a3-2, a conduction between the measuring unit 510 and the connection terminal b3-2, and a conduction between the measuring unit 510 and the connection terminal c3-2; and in the second period, the specific control signal controls the switch 542 to cause a conduction between the appliance 552 and the connection terminal a4-2, a conduction between the appliance 552 and the connection terminal b4-2, and a conduction between the appliance 552 and the connection terminal c4-2. For instance, the second period is adjacent to the first period.

Figure 4:
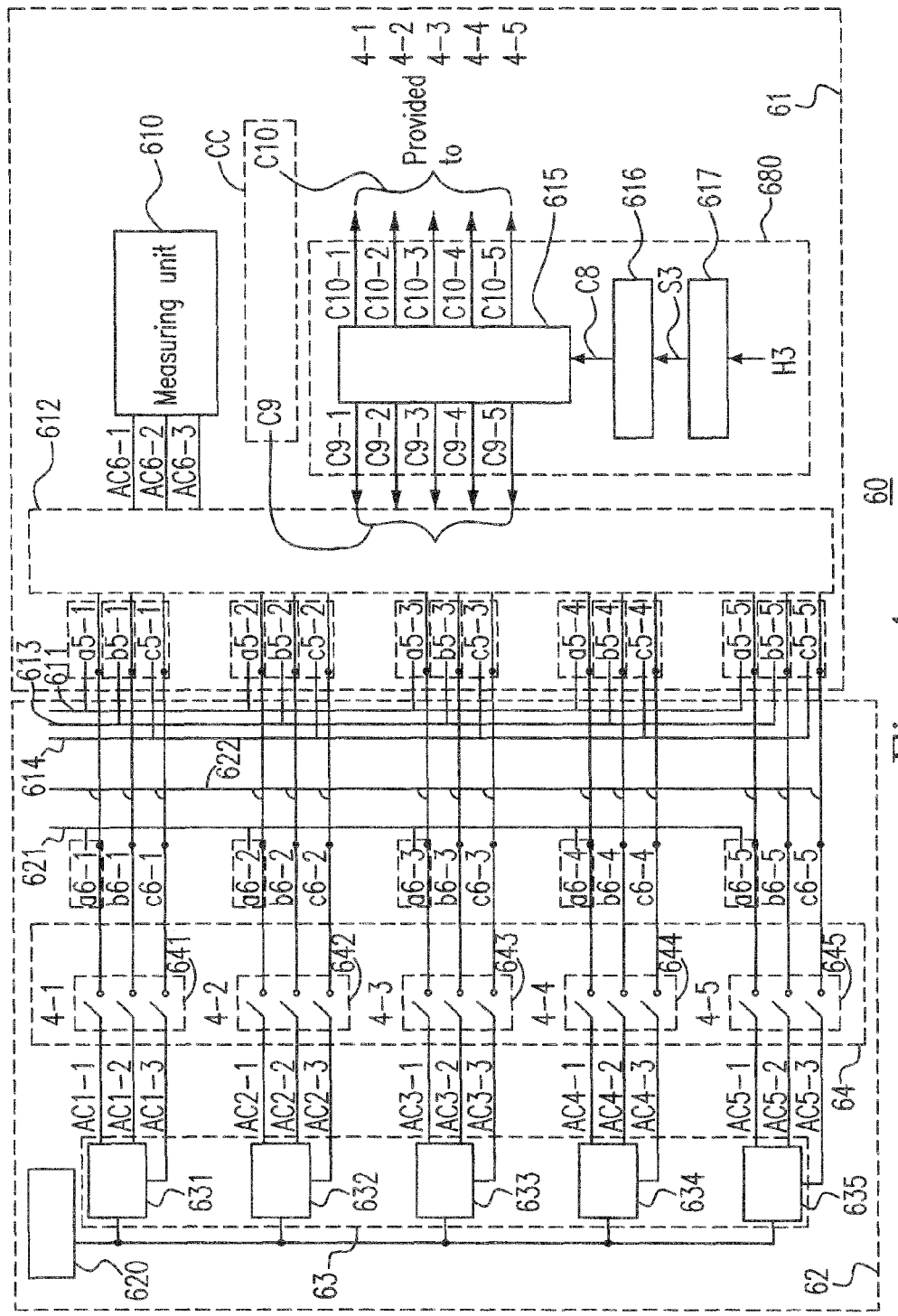
FIG. 4 is a schematic diagram showing a measuring system according to the third preferred embodiment of the present application.

Please refer to FIG. 4, which is a schematic diagram showing a measuring system 60 according to the third preferred embodiment of the present application. The measuring system 60 includes a measuring apparatus 61 and a circuit 62. The measuring apparatus 61 includes a measuring unit 610, a plurality of first connection terminals 611 and a matrix switch unit 612. The matrix switch unit 612 may selectively cause a conduction between the measuring unit 610 and one of the plurality of first connection terminals 611. The plurality of first connection terminals 611 include connection terminals a5-1, a5-2, a5-3, a5-4 and a5-5.

In FIG. 4, the circuit 62 further includes an alternating-current (AC) power source 620. The AC power source 620 provides a single-phase AC voltage of 110 V or 220 V to at least one appliance 63, or provides a three-phase AC voltage of 110 V or 220 V to the at least one appliance 63, which is dependent on the demand. The circuit 62 further includes at least one appliance 63, at least one second connection terminal 621, at least one selection switch 64 and at least one wire 622. In the third preferred embodiment of the present application, the at least one appliance 63 includes appliances 631, 632, 633, 634 and 635. The at least one second connection terminal 621 includes connection terminals a6-1, a6-2, a6-3, a6-4 and a6-5. The at least one selection switch 64 includes switches 641, 642, 643, 644 and 645. The at least one wire 622 includes a wire from the connection terminal a5-1 to the connection terminal a6-1 (which is denoted by the wire a5-1_a6-1), a wire from the connection terminal a5-2 to the connection terminal a6-2 (which is denoted by the wire a5-2_a6-2), and so on, as shown in FIG. 4.

The at least one selection switch 64 is respectively connected to the at least one corresponding appliance 63. Each selection switch corresponds to a respective appliance, further corresponds to a respective second terminal, and may selectively cause a conduction between the respective appliance and the respective second connection terminal. For instance, the switch 641 may selectively cause a conduction between the appliance 631 and the connection terminal a6-1.

The measuring apparatus 61 further includes a plurality of third connection terminals 613 and a plurality of fourth connection terminals 614. The matrix switch unit 612 may selectively cause a conduction between the measuring unit 610 and one of the plurality of third connection terminals 613, wherein the one of the plurality of third connection terminals 613 corresponds to the one of the plurality of first connection terminals 611. The plurality of third connection terminals 613 correspond to the plurality of first connection terminals 611, respectively, and include connection terminals b5-1, b5-2, b5-3, b5-4 and b5-5. The plurality of fourth connection terminals 614 correspond to the plurality of first connection terminals 611, respectively, and include connection terminals c5-1, c5-2, c5-3, c5-4 and c5-5. For instance, in the third preferred embodiment, the matrix switch unit 612 may selectively cause a conduction between the measuring unit 610 and the connection terminal b5-1, wherein the connection terminal b5-1 corresponds to the connection terminal a5-1. Conductions between the measuring unit 610 and the connection terminal a5-1 and between the measuring unit 610 and the connection terminal c5-1 are also caused.

The matrix switch unit 612 may selectively cause a conduction between the measuring unit 610 and one of the plurality of fourth connection terminals 614, wherein the one of the plurality of fourth connection terminals 614 corresponds to the one of the plurality of first connection terminals 611. For instance, in the third preferred embodiment, the matrix switch unit 612 may selectively cause a conduction between the measuring unit 610 and the connection terminal c5-1 corresponding to the connection terminal a5-1. Conductions between the measuring unit 610 and the connection terminal a5-1 and between the measuring unit 610 and the connection terminal b5-1 are also caused.

The measuring apparatus 61 further includes a processing unit 617, a communication interface 616 and at least one decode unit 615. The processing unit 617 receives or generates a third instruction H3, transforms the third instruction into a signal S3. The communication interface 616 is connected to the processing unit 617 and transforms the signal S3 into a signal C8 conforming to a communication protocol of the communication interface 616. The communication interface 616 includes an inter-integrated computer protocol (I2C) control interface, a serial peripheral interface (SPI) control interface, an RS232 control interface or an infrared control interface. At least one decode unit 615 is connected to the communication interface 616 and transforms the signal C8 into a control signal CC, which is used to control the matrix switch unit 612 and the at least one selection switch 64. The at least one decode unit 615 decodes the signal C8 to generate the control signal CC, which includes a control signal C9 and a control signal C10. The control signal C9 includes control signals C9-1, C9-2, C9-3, C9-4 and C9-5 for controlling the matrix switch unit 612. The control signal C10 includes control signals C10-1, C10-2, C10-3, C10-4 and C10-5 for controlling the switches 641, 642, 643, 644 and 645, respectively. In one embodiment, the measuring apparatus 61 further includes a control unit 680, which includes the processing unit 617, the communication interface 616 and the at least one decode unit 615. The control unit 680 receives or generates the third instruction H3, and transforms the third instruction H3 into the control signal CC.

In the third preferred embodiment of the present application, for instance, when the user (or the control unit 680) want the measuring unit 610 to measure the appliance 631, the user provides the third instruction H3 to the processing unit 617 (or the processing unit 617 provides the third instruction H3) for controlling the matrix switch unit 612 to cause conductions between the measuring unit 610 and each of the connection terminals a5-1, b5-1 and c5-1, and controlling the relay 4-1 to cause conductions between the appliance 631 and each of the connection terminals a6-1, b6-1 and c6-1. In one embodiment, the operation of the measuring system 60 in FIG. 4 is similar to the operation of the measuring system 50 in FIG. 3. For instance, the matrix switch unit 612 includes switches 531, 532, 533, 534 and 535; and the control signals C9-1, C9-2, C9-3, C9-4 and C9-5 control the switches 531, 532, 533, 534 and 535, respectively.

Figure 5A:
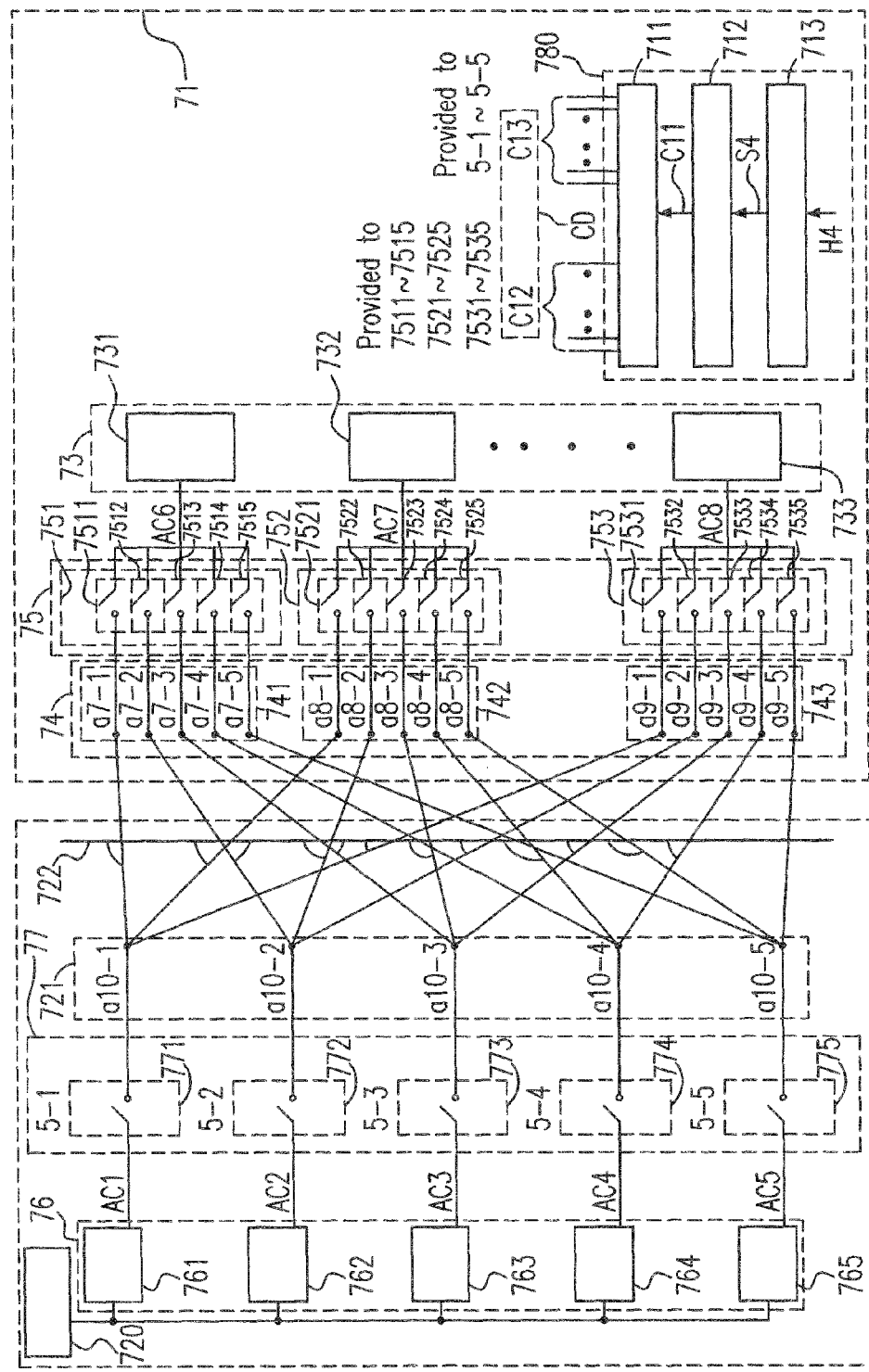
FIG. 5(a) is a schematic diagram showing a measuring system according to the fourth preferred embodiment of the present application.

Please refer to FIG. 5(a), which is a schematic diagram showing a measuring system 70 according to the fourth preferred embodiment of the present application. The measuring system 70 includes a measuring apparatus 71 and a circuit 72. The measuring apparatus 71 include a plurality of measuring units 73, a plurality of connection terminal groups 74 and a plurality of matrix switch units 75. The plurality of measuring units 73 includes measuring units 731, 732, . . . and 733. The measuring units 731, 732 and 733 respectively include connection pins AC6, AC7 and AC8, and each of the connection pins AC6, AC7 and AC8 includes a plurality of respective connection sub-pins (not shown) for the measurements of the single-phase or the three-phase voltages in the circuit 72. The plurality of connection terminal groups 74 include connection terminal groups 741, 742, . . . and 743. The connection terminal group 741 includes connection terminals a7-1, a7-2, a7-3, a7-4 and a7-5. The connection terminal group 742 includes connection terminals a8-1, a8-2, a8-3, a8-4 and a8-5. The connection terminal group 743 includes connection terminals a9-1, a9-2, a9-3, a9-4 and a9-5. The plurality of matrix switch units 75 include matrix switch units 751, 752, . . . and 753. The matrix switch unit 751 includes switches 7511, 7512, 7513, 7514 and 7515; and the structures of the matrix switch units 752 and 753 are similarly shown in FIG. 5(a). Each switch in the plurality of matrix switch units 75 may be independently turned on; and the each switch (similar to the switch 531 in FIG. 3) includes a respective plurality of sub-switches (not shown) for the measurements of the single-phase or three-phase voltages in the circuit 72. The plurality of switches 7511, 7512, 7513, 7514 and 7515 may be replaced with a plurality of relays, respectively; and the respective plurality of sub-switches are controlled to be simultaneously turned on/off.

In FIG. 5(a), the circuit 72 has a plurality of electrical parameters. The plurality of measuring units 73 is used for measuring the plurality of electrical parameters. The plurality of electrical parameters include a voltage, a current, a power consumption, an energy consumption or any combinations thereof. The plurality of matrix switch units 75 are electrically connected to the plurality of measuring units 73, respectively, and are electrically connected to the plurality of connection terminal groups 74, respectively. The plurality of matrix switch units 75 selectively cause at least a conduction between at least one of the plurality of matrix switch units 75 (the connection terminal group 741, the connection terminal group 742, the connection terminal group 743 or any combinations thereof) and at least one connection terminal, wherein the at least one connection terminal is respectively in at least one of the connection terminal groups corresponding respectively to the at least one of the plurality of matrix switch units 75. For instance, in a first period, the matrix switch unit 751 is selected to cause a conduction between the measuring unit 731 and the connection terminal a7-1, and the matrix switch unit 752 is selected to cause a conduction between the measuring unit 732 and the connection terminal a8-2. In a second time period, the matrix switch unit 751 is selected to cause a conduction between the measuring unit 731 and the connection terminal a7-3, and the matrix switch unit 752 is selected to cause a conduction between the measuring unit 732 and the connection terminal a8-4. Each of the plurality of measuring units 73 preferably includes a respective intelligent socket 73A or a respective intelligent meter 73B. For instance, for the measurements of three-phase voltages, the conduction between the measuring unit 731 and the connection terminal a7-3 includes three sub-conductions, and the conduction between the measuring unit 732 and the connection terminal a8-4 includes three sub-conductions.

The circuit 72 includes an AC power source 720, which provides a single-phase AC voltage of 110 V or 220 V to at least one appliance 76, or provides a three-phase AC voltage of 110 V or 220 V to the at least one appliance 76, which is dependent on the demand. The circuit 72 further includes at least one appliance 76, at least one second connection terminal 721, at least one selection switch 77 and at least one wire 722. The at least one appliance 76 includes appliances 761, 762, 763, 764 and 765, which include connection pins AC1, AC2, AC3, AC4 and AC5, respectively. Each connection pin further includes a respective plurality of connection sub-pins (not shown; and similar to the pins AC1-1, AC1-2 and AC1-3 in FIG. 3) for the measurements of the single-phase or three-phase voltages in the circuit 72. The at least one second connection terminal 721 includes connection terminals a10-1, a10-2, a10-3, a10-4 and a10-5. Each connection terminal includes a plurality of connection sub-terminals (not shown; and similar to the connection terminals a4-1, b4-1 and c4-1 in FIG. 3) for the measurements of the single-phase or three-phase voltages in the circuit 72.

The at least one selection switch 77 includes switches 771, 772, 773, 774 and 775, which may be preferably replaced with the relays 5-1, 5-2, 5-3, 5-4 and 5-5, respectively. Each of the switches 771, 772, 773, 774 and 775 may be replaced with a respective plurality of transistors, which is dependent on the demand of the user. Each (similar to the relay 3-1 in FIG. 3) of the relays 5-1, 5-2, 5-3, 5-4 and 5-5 includes a respective plurality of sub-relays (not shown). The respective plurality of sub-relays are controlled to be simultaneously turned on/off for the measurements of the single-phase or three-phase voltages in the circuit 72. The at least one wire 722 includes a wire from the connection terminal a7-1 to the connection terminal a10-1 (which is denoted by the wire a7-1_a10-1), a wire from the connection terminal a7-2 to the connection terminal a10-2 (which is denoted by the wire a7-2_a10-2), and so on, as shown in FIG. 5(a). In FIG. 5(a), the at least one wire 722 is only shown by conduction path lines between the plurality of matrix switch units 75 and the at least one selection switch 77. The wire groups, respectively corresponding to the conduction path lines, are respectively connected to form the conduction path lines. Each conduction path line includes a respective plurality of wires (not shown; and similar to the wires a3-1_a4-1, b3-1_b4-1 and c3-1_c4-1 in FIG. 3) for the measurements of the single-phase or three-phase voltages in the circuit 72.

In the fourth preferred embodiment of the present application, the at least one selection switch 77 is respectively connected to the at least one appliance corresponding respectively thereto. Each selection switch may selectively cause a conduction between the corresponding appliance and the corresponding second connection terminal. For instance, the connection pin AC1 of the appliance 761 is connected to the switch 771, and the switch 771 may selectively cause a conduction between the appliance 761 and the connection terminal a10-1. The at least one wire 722 connects the corresponding second connection terminal with the connection terminal in the corresponding connection terminal group. For instance, the wire a7-1_a10-1 connects the corresponding second connection terminal a10-1 with the connection terminal a7-1 in the connection terminal group 741 corresponding thereto, wherein the at least one appliance 76 of appliances 761, 762, 763, 764 and 765 correspond to the connection terminal group 741 of the connection terminals a7-1, a7-2, a7-3, a7-4 and a7-5, respectively, correspond to the connection terminal group 742 of the connection terminals a8-1, a8-2, a8-3, a8-4 and a8-5, respectively, and correspond to the connection terminal group 743 of the connection terminals a9-1, a9-2, a9-3, a9-4 and a9-5, respectively.

The measuring apparatus 71 further includes a processing unit 713, a communication interface 712 and at least one decode unit 711. The processing unit 713 receives or generates a fourth instruction H4, and transforms the fourth instruction H4 into a signal S4. The communication interface 712 is connected to the processing unit 713 and transforms the signal S4 into a signal C11 conforming to a communication protocol of the communication interface 712. The communication interface 712 includes an inter-integrated computer protocol (I2C) control interface, a serial peripheral interface (SPI) control interface, a RS232 control interface or an infrared control interface. The at least one decode unit 711 is connected to the communication interface 712 and transforms the signal C11 into a control signal CD. The control signal CD is used to control the plurality of matrix switch units 75 and the at least one selection switch 77. The at least one decode unit 711 decodes the signal C11 to generate the control signal CD including a control signal C12 and a control signal C13. The control signal C12 is used to control the plurality of matrix switch units 75. The control signal C13 is used to control the at least one selection switch 77. For instance, the control signal C12 includes a plurality of control signals, which control the switches 7511~7515, 7521~7525, . . . , and 7531~7535, respectively; and the control signal C13 includes a plurality of control signals, which control the switches 771, 772, 773, 774 and 775, respectively. In one embodiment, the measuring apparatus 61 further includes a control unit 780, which includes the processing unit 713, the communication interface 712 and the at least one decode unit 711. The control unit 780 receives or generates the fourth instruction H4, and transforms the fourth instruction H4 into the control signal CD.

Figure 5B:
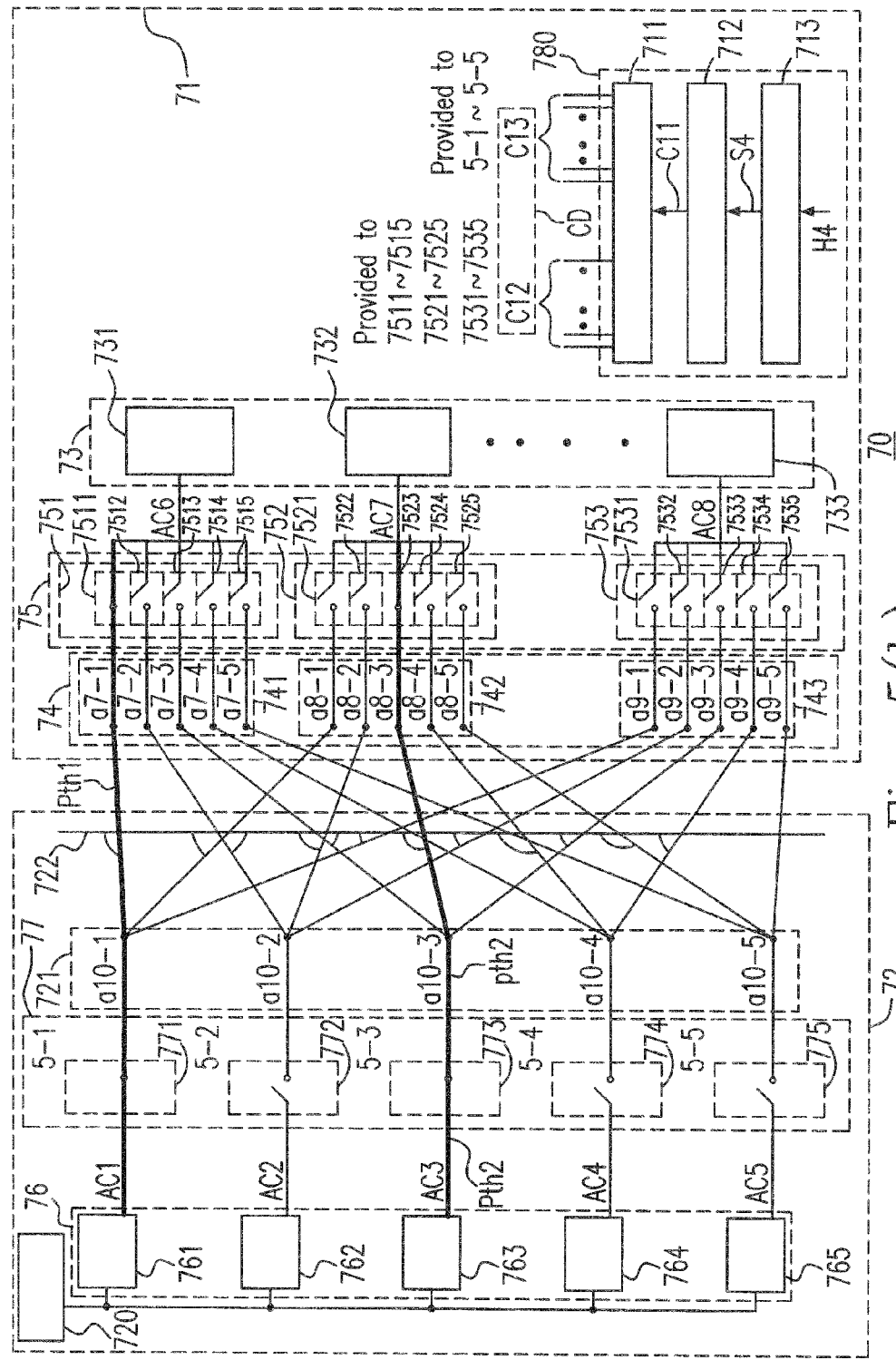
FIG. 5(b) is a schematic diagram showing measurement paths in a first period according to the fifth preferred embodiment of the present application.
Figure 5C:
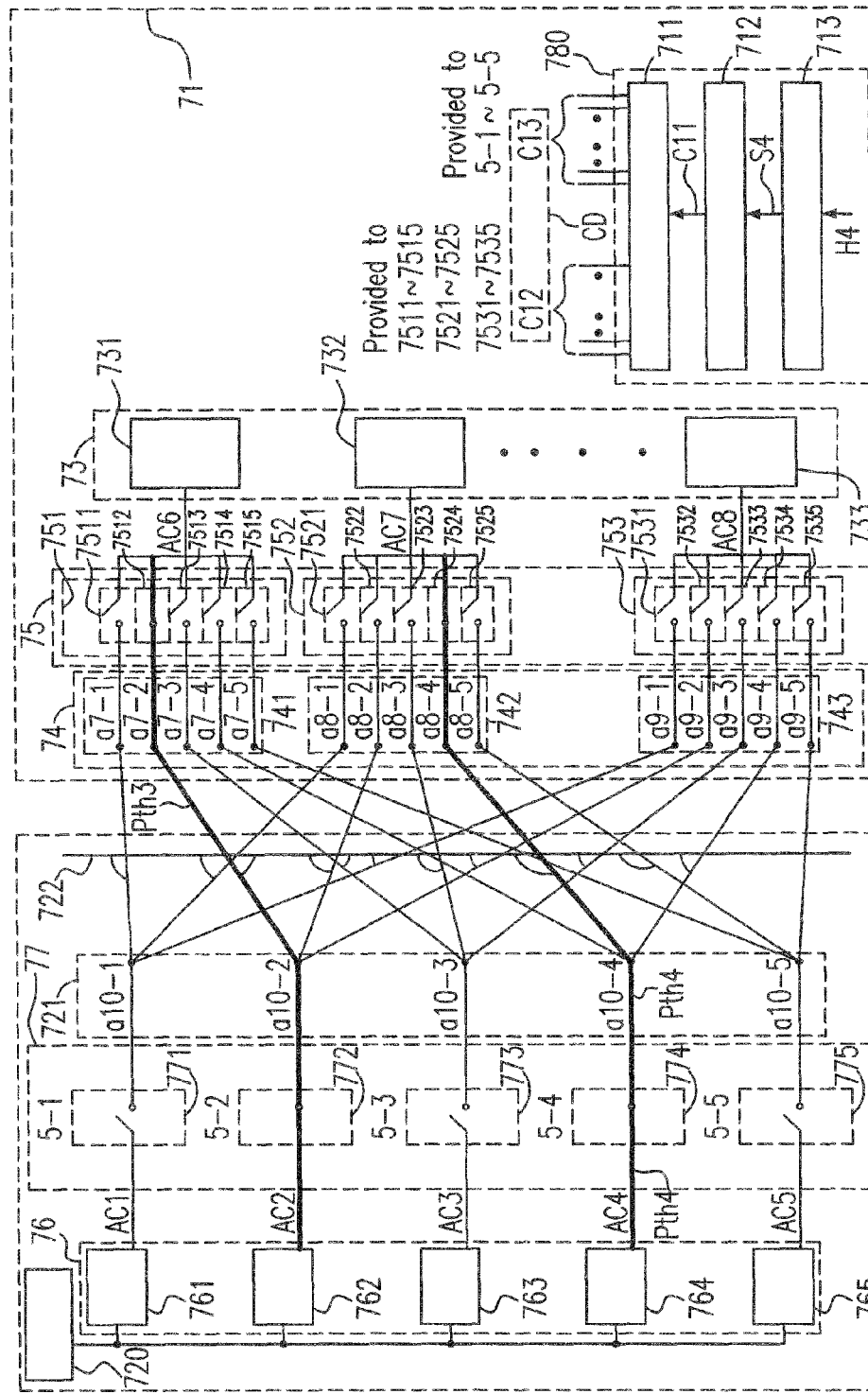
FIG. 5(c) is a schematic diagram showing measurement paths in a second period according to the fifth preferred embodiment of the present application.

Please refer to FIG. 5(b) and FIG. 5(c), which are schematic diagrams showing the measurement paths in the first period and the second period according to the fifth preferred embodiment of the present application, respectively. In the fifth preferred embodiment of the present application, the user (or the control unit 780) may use the plurality of measuring units 73 to measure the at least one appliance 76 in the circuit 72 at the same time. For instance, in the first period, the user (or the control unit 780) may let the measuring unit 731 measure the electrical parameter of the appliance 761, and let the measuring unit 732 measure the electrical parameter of the appliance 763, and in the second period, the user (or the control unit 780) may let the measuring unit 731 measure the electrical parameter of the appliance 762 and let the measuring unit 732 measure the electrical parameter of the appliance 764.

Accordingly, in the first period, the switch 7511 as well as the switch 771 are turned on and a path Pth1 is formed, so that the measuring unit 731 could measure the electrical parameter of the appliance 761. Further, in the first period, the switch 7523 as well as the switch 773 are turned on and a path Pth2 is formed, so that the measuring unit 732 could measure the electrical parameter of the appliance 763. In the second period, the switch 7512 as well as the switch 772 are turned on and a path Pth3 is formed, so that the measuring unit 731 could measure the electrical parameter of the appliance 762. Further, in the second period, the switch 7524 as well as the switch 774 are turned on and a path Pth4 is formed, so that the measuring unit 732 could measure the electrical parameter of the appliance 764, as shown in FIG. 5(c). For instance, the second period is adjacent to the first period.

Figure 5D:
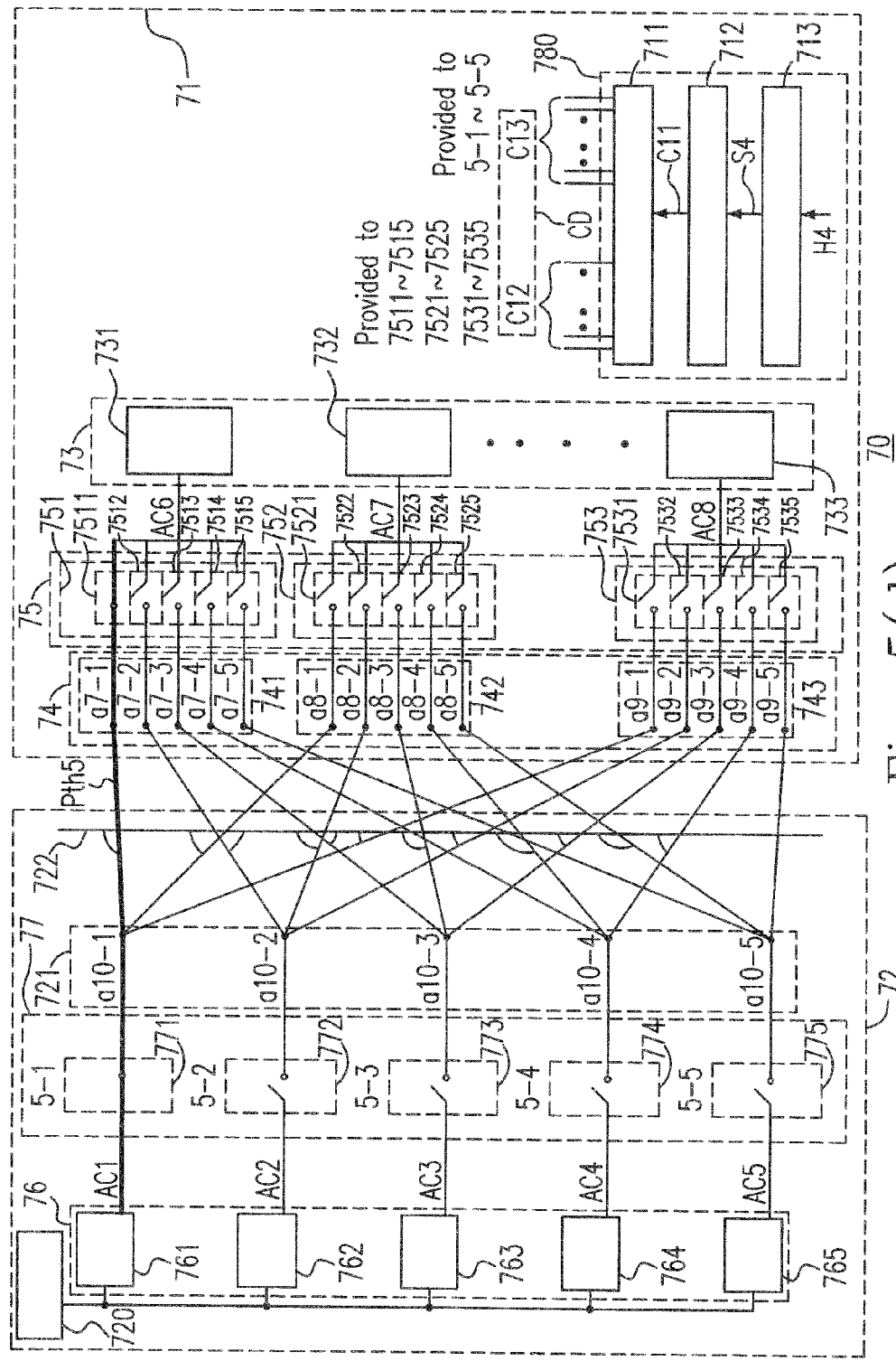
FIG. 5(d) is a schematic diagram showing a measurement path in a first period according to the sixth preferred embodiment of the present application.
Figure 5E:
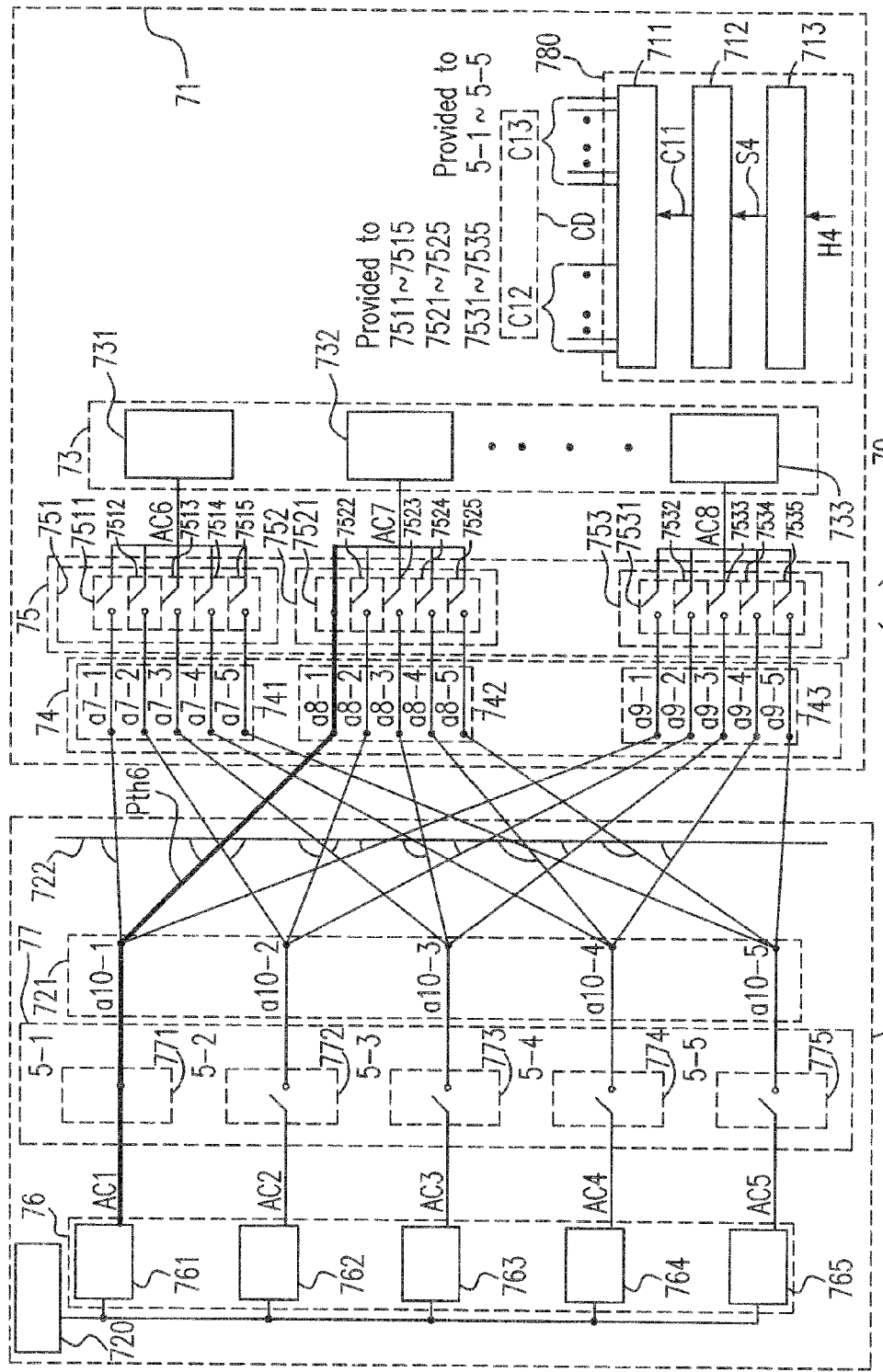
FIG. 5(e) is a schematic diagram showing a measurement path in a second period according to the sixth preferred embodiment of the present application.

Please refer to FIG. 5(d) and FIG. 5(e), which are schematic diagrams showing the measurement paths in the first period and the second period according to the sixth preferred embodiment of the present application, respectively. In the sixth preferred embodiment of the present application, the user (or the control unit 780) could designate any measuring unit to measure the electrical parameter of any appliance, which is more convenient while compared with the one-to-one measurements disclosed in the prior art. For instance, the measuring unit 731 is used to measure the electrical parameter of the appliance 761 in a first period, and the measurement path is shown by the path Pth5 in FIG. 5(d). However, when the measuring unit 731 is broken, the user (or the control unit 780) could designate the measuring unit 732 to measure the electrical parameter of the appliance 761, and the measurement path is shown by the path Pth6 in FIG. 5(e). Such advantage is unachievable by the prior techniques.

Please refer to FIG. 6(a), which shows the method of measuring the electrical parameters of the circuit 42 of the present application. Please refer to FIG. 2. The method is used for the measuring apparatus 41. The measuring apparatus 41 includes a measuring unit 410, a first selection switch 412 and a plurality of first connection terminals a1-1, a1-2, a1-3, a1-4 and a1-5. The circuit 42 includes a plurality of appliances 431, 432, 433, 434 and 435, a plurality of second selection switches 441, 442, 443, 444 and 445, and a plurality of second connection terminals a2-1, a2-2, a2-3, a2-4 and a2-5. The method includes the following steps. In Step S601, in a first period, the first selection switch 412 selectively causes a first conduction between the measuring unit 410 and one (such as a1-1) of the plurality of first connection terminals a1-1, a1-2, a1-3, a1-4 and a1-5, and the plurality of second selection switches 441, 442, 443, 444 and 445 selectively causes a second conduction between one (such as 431) of the plurality of appliances 431, 432, 433, 434 and 435 and one (such as a2-1) of the plurality of second connection terminals a2-1, a2-2, a2-3, a2-4 and a2-5, wherein the one (such as a1-1) of the plurality of first connection terminals a1-1, a1-2, a1-3, a1-4 and a1-5 corresponds to the one (such as a2-1) of the plurality of second connection terminals a2-1, a2-2, a2-3, a2-4 and a2-5. In Step S602, in a second period, the first selection switch 412 selectively causes a third conduction between the measuring unit 410 and another one (such as a1-2) of the plurality of first connection terminals a1-1, a1-2, a1-3, a1-4 and a1-5, and the plurality of second selection switches 441, 442, 443, 444 and 445 selectively causes a fourth conduction between another one (such as 432) of the plurality of appliances 431, 432, 433, 434 and 435 and another one (such as a2-2) of the plurality of second connection terminals a2-1, a2-2, a2-3, a2-4 and a2-5, wherein the another one (such as a1-2) of the plurality of first connection terminals a1-1, a1-2, a1-3, a1-4 and a1-5 corresponds to the another one (such as a2-2) of the plurality of second connection terminals a2-1, a2-2, a2-3, a2-4 and a2-5. For instance, the first period for measuring an electrical parameter of the appliances 431 is adjacent to the second period for measuring an electrical parameter of the appliances 432.

Please refer to FIG. 6(b), which shows the method of measuring the electrical parameters of the circuit 72 of the present application. Please refer to FIG. 5(a). The method is used for the measuring apparatus 71. The measuring apparatus 71 includes a plurality of measuring units 731, 732 and 733, a plurality of matrix switch units 751, 752 and 753, and a plurality of connection terminal groups 741, 742 and 743. The circuit 72 includes a plurality of appliances 761, 762, 763, 764 and 765, a plurality of selection switches 771, 772, 773, 774 and 775, and a plurality of first connection terminals a10-1, a10-2, a10-3, a10-4 and a10-5. The method includes the following steps. In Step S701, in a first period, the plurality of matrix switch units 751, 752 and 753 selectively causes a first conduction between one (such as 751) of the plurality of matrix switch units 751, 752 and 753 and a second connection terminal (such as a7-1) included in one (such as 741) of the plurality of connection terminal groups 741, 742 and 743. In Step S702, in a second period, the plurality of matrix switch units 751, 752 and 753 selectively causes a second conduction between another one (such as 752) of the plurality of matrix switch units 751, 752 and 753 and a third connection terminal (such as a8-1) included in another one (such as 742) of the plurality of connection terminal groups 741, 742 and 743, wherein the second connection terminal (such as a7-1) corresponds to the third connection terminal (such as a8-1). In the fifth and sixth preferred embodiments, the abovementioned methods of measuring the electrical parameters of the circuit 72 are used. For instance, the first period for measuring a first electrical parameter of the appliances 761 is adjacent to the second period for measuring a second electrical parameter of the appliances 761.

Embodiments:

1. An apparatus for measuring an electrical parameter of a circuit includes a measuring unit, a plurality of first connection terminals and a first selection switch. The measuring unit measures the electrical parameter. The first selection switch selectively causes a first conduction between the first selection switch and at least one of the plurality of first connection terminals.

2. The apparatus of embodiment 1 wherein the first conduction is caused between the measuring unit and the at least one of the plurality of first connection terminals.

3. The apparatus of embodiments 1-2 wherein the circuit includes at least an appliance, at least a second connection terminal, at least a second selection switch and at least a wire. The at least a second selection switch is connected to the respective appliance, and selectively causes a second conduction between the respective appliance and the respective second connection terminal. The at least a wire connects the second connection terminal to one of the plurality of first connection terminals.

4. The apparatus of embodiments 1-3 wherein the measuring unit includes one of an intelligent socket and an intelligent meter; the electrical parameter includes at least one selected from a group consisting of a voltage, a current, a power consumption and an energy consumption; the apparatus further includes a third selection switch, a fourth selection switch, a plurality of third connection terminals and a plurality of fourth connection terminals; the third selection switch selectively causes a third conduction between the measuring unit and one of the plurality of third connection terminals, wherein one of the plurality of third connection terminals corresponds to one of the plurality of first connection terminals; the fourth selection switch selectively causes a fourth conduction between the measuring unit and one of the plurality of fourth connection terminals, wherein one of the plurality of fourth connection terminals corresponds to one of the plurality of first connection terminals; and each of the first, the third and the fourth selection switches includes a respective multiplexer, and the second selection switch includes one of a relay and a transistor.

5. The apparatus of embodiments 1-4 further includes a processing unit, a communication interface and at least a decode unit. The processing unit receives an instruction. The communication interface has a communication protocol, is connected to the processing unit, and transforms the instruction into a first signal conforming to the communication protocol, wherein the communication interface includes one selected from a group consisting of an inter-integrated circuit (I2C) control interface, a serial peripheral interface bus (SPI) control interface, an RS-232 standard control interface and an infrared control interface. The at least a decode unit is connected to the communication interface and transforming the first signal into a control signal for turning on the first and the second selection switches.

6. The apparatus of embodiments 1-5 further includes a second selection switch and at least a third selection switch, wherein the first selection switch, the second selection switch and the third selection switch constitute a set of selection switches; the set of selection switches is selectively electrically connected to the plurality of first connection terminals; and the first selection switch selectively causes the first conduction between the first selection switch and the at least one of the plurality of first connection terminals when the first selection switch is selected.

7. The apparatus of embodiments 1-6 wherein the circuit includes at least an appliance, at least a second connection terminal, at least a fourth selection switch and at least a wire. The at least a fourth selection switch is connected to the respective appliance, wherein the respective fourth selection switch selectively causes a second conduction between the respective appliance and the respective second connection terminal. The at least a wire connects the second connection terminal to one of the plurality of first connection terminals.

8. The apparatus of embodiments 1-7 wherein the measuring unit includes one of an intelligent socket and an intelligent meter; the electrical parameter includes at least one selected from a group consisting of a voltage, a current, a power consumption and an energy consumption; the apparatus further includes a plurality of third connection terminals and a plurality of fourth connection terminals; the set of selection switches is selectively electrically connected to the plurality of third connection terminals; the second selection switch causes a third conduction between the second selection switch and at least one of the plurality of third connection terminals when the second selection switch is selected; the set of selection switches is selectively electrically connected to the plurality of fourth connection terminals; the third selection switch causes a fourth conduction between the third selection switch and at least one of the plurality of fourth connection terminals when the third selection switch is selected; each of the set of selection switches includes one of a first relay and a first transistor; and the fourth selection switch includes one of a second relay and a second transistor.

9. An apparatus for measuring an electrical parameter of a circuit includes a first measuring unit, a plurality of first connection terminals and a first matrix switch unit. The first measuring unit measures the electrical parameter. The first matrix switch unit selectively causes a first conduction between the first matrix switch unit and at least one of the plurality of first connection terminals.

10. The apparatus of embodiment 9 wherein the first conduction is caused between the first measuring unit and the at least one of the plurality of first connection terminals.

11. The apparatus of embodiment 9-10 wherein the circuit includes at least an appliance, at least a second connection terminal, at least a selection switch and at least a wire. The at least a selection switch is connected to the respective appliance, wherein the respective selection switch selectively causes a second conduction between the respective appliance and the respective second connection terminal. The at least a wire connects the second connection terminal to one of the plurality of first connection terminals.

12. The apparatus of embodiment 9-11 wherein the first measuring unit includes one of an intelligent socket and an intelligent meter; the electrical parameter includes at least one selected from a group consisting of a voltage, a current, a power consumption and an energy consumption; the apparatus further includes a plurality of third connection terminals and a plurality of fourth connection terminals; the first matrix switch unit selectively causes a third conduction between the first measuring unit and one of the plurality of third connection terminals, wherein one of the plurality of third connection terminals corresponds to one of the plurality of first connection terminals; the first matrix switch unit selectively causes a fourth conduction between the first measuring unit and one of the plurality of fourth connection terminals, wherein one of the plurality of fourth connection terminals corresponds to one of the plurality of first connection terminals; and the first matrix switch unit includes one of a relay and a transistor.

13. The apparatus of embodiment 9-12 further includes a first connection terminal group, a second measuring unit, a second matrix switch unit and a second connection terminal group. The first connection terminal group includes a second connection terminal and a third connection terminal, wherein the first matrix switch unit is electrically connected between the first measuring unit and the first connection terminal group. The second connection terminal group includes a fourth connection terminal and a fifth connection terminal, wherein the second matrix switch unit is electrically connected between the second measuring unit and the second connection terminal group. The second and the third connection terminals correspond to the fourth and the fifth connection terminals, respectively; the first matrix switch unit selectively causes the first conduction between the first matrix switch unit and one of the second and the third connection terminals; and the second matrix switch unit selectively causes a second conduction between the second matrix switch unit and one of the fourth and the fifth connection terminals.

14. The apparatus of embodiment 9-13 wherein the circuit includes a first appliance, second appliance, a sixth connection terminal, a seventh connection terminal, a first selection switch, a second selection switch, a first wire, a second wire, a third wire and a fourth wire. The first selection switch is connected to the first appliance, and selectively causing a third conduction between the first appliance and the sixth connection terminal. The second selection switch is connected to the second appliance, and selectively causing a fourth conduction between the second appliance and the seventh connection terminal. The first wire connects the sixth connection terminal to the second connection terminal; the second wire connecting the sixth connection terminal to the fourth connection terminal; the third wire connecting the seventh connection terminal to the third connection terminal; and the fourth wire connecting the seventh connection terminal to the fifth connection terminal.

15. The apparatus of embodiment 9-14 wherein each of the first and the second measuring units includes one of an intelligent socket and an intelligent meter; the electrical parameter includes at least one selected from a group consisting of a voltage, a current, a power consumption and an energy consumption; and each of the first and the second selection switches includes one of a relay and a transistor.

16. A method for measuring an electrical parameter of a circuit, the method includes steps of: providing a measuring apparatus, wherein the measuring apparatus includes a first terminal, at least a second terminal, a first selection switch and at least a second selection switch; in a first period, causing the first selection switch to selectively form a first conduction between the first selection switch and the first connection terminal; and in a second period, causing the second selection switch to selectively form a second conduction between the second selection switch and the second connection terminal.

17. The method of embodiment 16 further includes a step of providing a first measuring unit in the measuring apparatus, wherein
the circuit includes at least an appliance, a third connection terminal, at least a fourth connection terminal and at least a third selection switch; the first selection switch is the second selection switch; the first conduction is caused between the measuring unit and the first connection terminal; and the second conduction is caused between the measuring unit and the second connection terminal.

18. The method of embodiment 16-17 wherein the first and the second connection terminals correspond to the third and the fourth connection terminals, respectively, and the method further comprising steps of: in the first period, causing the third selection switch to form a third conduction between the third connection terminal and the appliance; and in the second period, causing the third selection switch to form a fourth conduction between the fourth connection terminal and the appliance.

19. The method of embodiment 16-18 further includes steps of: receiving a first instruction; transforming the first instruction into a first signal conforming to a communication protocol; transforming the first signal into a first control signal for making the first and the third conductions; receiving a second instruction;
transforming the second instruction into a second signal conforming to the communication protocol; and transforming the second signal into a second control signal for making the second and the fourth conductions.

20. The method of embodiment 16-19 wherein the measuring apparatus further includes at least a second measuring unit.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An apparatus for measuring an electrical parameter of a circuit, wherein the circuit includes a plurality of appliances and a plurality of first connection terminals to be respectively electrically connected to the plurality of appliances, the plurality of appliances include an appliance having the electrical parameter, and the appliance is electrically connected to a corresponding one of the plurality of first connection terminals when the electrical parameter is measured, the apparatus comprising:
    a first measuring unit including a first connection pin, and measuring the electrical parameter through a first conduction in a first period;
    a second measuring unit including a second connection pin, and measuring the electrical parameter through a second conduction in a second period different from the first period;
    a plurality of second connection terminals respectively electrically connected to the plurality of first connection terminals;
    a plurality of third connection terminals respectively electrically connected to the plurality of first connection terminals;
    a plurality of first selection switches respectively having a plurality of first switch terminals, and a plurality of second switch terminals respectively corresponding to the plurality of first switch terminals, and causing the first conduction between the first connection pin and the respective corresponding first connection terminal in the first period, wherein the plurality of first switch terminals are commonly electrically connected to the first connection pin, and the plurality of second switch terminals are respectively electrically connected to the plurality of second connection terminals: and
    a plurality of second selection switches respectively having a plurality of third switch terminals, and a plurality of fourth switch terminals respectively corresponding to the plurality of third switch terminals, and causing the second conduction between the second connection pin and the respective corresponding first connection terminal in the second period, wherein the plurality of third switch terminals are commonly electrically connected to the second connection pin, and the plurality of fourth switch terminals are respectively electrically connected to the plurality of third connection terminals.

2. An apparatus according to claim 1, wherein the circuit further includes:
    a plurality of third selection switches respectively electrically connected between the plurality of appliances and the plurality of first connection terminals, and causing between the respective appliance and the respective corresponding first connection terminal a third conduction in the first period and a fourth conduction in the second period;
    a plurality of first wires respectively connecting the plurality of first connection terminals to the plurality of second connection terminals; and
    a plurality of second wires respectively connecting the plurality of first connection terminals to the plurality of third connection terminals.

3. An apparatus according to claim 2, further comprising:
a processing unit receiving an instruction;
    a communication interface having a communication protocol, connected to the processing unit, and transforming the instruction into a first signal conforming to the communication protocol, wherein the communication interface includes one selected from a group consisting of an inter-integrated circuit (I2C) control interface, a serial peripheral interface bus (SPI) control interface, an RS-232 standard control interface and an infrared control interface; and
    at least a decode unit connected to the communication interface and transforming the first signal into a control signal for controlling the plurality of first selection switches, the plurality of second selection switches and the plurality of third selection switches.

4. An apparatus for measuring a first electrical parameter of a circuit, wherein the circuit includes a plurality of appliances and a plurality of first connection terminals to be respectively electrically connected to the plurality of appliances, the plurality of appliances include a first appliance having the first electrical parameter, and the first appliance is electrically connected to a first corresponding one of the plurality of first connection terminals when the first electrical parameter is measured, the apparatus comprising:

a first measuring unit including a first connection pin, and measuring the first electrical parameter through a first conduction in a first period;

a second measuring unit including a second connection pin, and measuring the first electrical parameter through a second conduction in a second period different from the first period;

a plurality of second connection terminals respectively electrically connected to the plurality of first connection terminals;

a plurality of third connection terminals respectively electrically connected to the plurality of first connection terminals;

a first matrix switch unit having a plurality of first switch terminals and a plurality of second switch terminals respectively corresponding to the plurality of first switch terminals, and causing the first conduction between the first connection pin and the respective first corresponding first connection terminal in the first period, wherein the plurality of first switch terminals are commonly electrically connected to the first connection pin, and the plurality of second switch terminals are respectively electrically connected to the plurality of second connection terminals; and a second matrix switch unit having a plurality of third switch terminals and a plurality of fourth switch terminals respectively corresponding to the plurality of third switch terminals, and causing the second conduction between the second connection pin and the respective first corresponding first connection terminal in the second period, wherein the plurality of third switch terminals are commonly electrically connected to the second connection pin, and the plurality of fourth switch terminals are respectively electrically connected to the plurality of third connection terminals.

5. An apparatus according to claim 4, wherein the circuit further includes:

a plurality of selection switches respectively electrically connected between the plurality of appliances and the plurality of first connection terminals, and causing between the first appliance and the respective first corresponding first connection terminal a third conduction in the first period and a fourth conduction in the second period;

a plurality of first wires respectively connecting the plurality of first connection terminals to the plurality of second connection terminals; and a plurality of second wires respectively connecting the plurality of first connection terminals to the plurality of third connection terminals.

6. An apparatus according to claim 4, wherein:

the first measuring unit includes one of an intelligent socket and an intelligent meter;

the first electrical parameter includes at least one selected from a group consisting of a voltage, a current, a power consumption and an energy consumption; and the first matrix switch unit includes one of a relay and a transistor.

7. An apparatus according to claim 4, further comprising:

a first connection terminal group including the plurality of second connection terminals;

a second connection terminal group including the plurality of third connection terminals, wherein:

the circuit further includes a plurality of selection switches;

the plurality of selection switches are respectively electrically connected between the plurality of appliances and the plurality of first connection terminals, and cause between the first appliance and the respective first corresponding first connection terminal a third conduction in the first period and a fourth conduction in the second period;

the plurality of appliances further include a second appliance having a second electrical parameter;

the second appliance is electrically connected to a second corresponding one of the plurality of first connection terminals different from the respective first corresponding first connection terminal when the second electrical parameter is to be measured in the first period;

the second matrix switch unit further causes a fifth conduction between the second connection pin and the respective second corresponding first connection terminal in the first period; and the second measuring unit further measures the second electrical parameter through the fifth conduction.

8. An apparatus according to claim 7, wherein the plurality of selection switches further cause a sixth conduction between the second appliance and the respective second corresponding first connection terminal in the first period.

9. An apparatus according to claim 8, wherein:

each of the first and the second measuring units includes one of an intelligent socket and an intelligent meter;

the second electrical parameter includes at least one selected from a group consisting of a voltage, a current, a power consumption and an energy consumption; and each of the plurality of selection switches includes one of a relay and a transistor.

* * * * *